United States Patent
Wada et al.

(10) Patent No.: US 6,859,158 B2
(45) Date of Patent: Feb. 22, 2005

(54) ANALOG-DIGITAL CONVERSION CIRCUIT

(75) Inventors: Atsushi Wada, Ogaki (JP); Kuniyuki Tani, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 23 days.

(21) Appl. No.: 10/653,251

(22) Filed: Sep. 3, 2003

(65) Prior Publication Data

US 2004/0041722 A1 Mar. 4, 2004

(30) Foreign Application Priority Data

Sep. 3, 2002 (JP) ........................................ 2002-258058

(51) Int. Cl.⁷ ................................................ H03M 1/12
(52) U.S. Cl. ........................ 341/155; 341/156; 341/126
(58) Field of Search ................................. 341/155, 156, 341/126, 110, 118, 120, 144, 145, 161

(56) References Cited

U.S. PATENT DOCUMENTS

| | | | | |
|---|---|---|---|---|
| 5,159,342 A | | 10/1992 | Yotsuyanagi | |
| 5,821,893 A | * | 10/1998 | Kumamoto et al. | 341/161 |
| 6,097,326 A | * | 8/2000 | Opris et al. | 341/161 |
| 6,304,206 B1 | * | 10/2001 | Wada et al. | 341/162 |
| 2003/0006926 A1 | * | 1/2003 | Nakai et al. | 341/161 |

FOREIGN PATENT DOCUMENTS

JP    11-88172    3/1999

* cited by examiner

Primary Examiner—Brian Young
Assistant Examiner—John B Nguyen
(74) Attorney, Agent, or Firm—McDermott Will & Emery LLP

(57) ABSTRACT

An operational amplifier, a sub A/D converter, a D/A converter, and an operation amplifier in a first stage circuit operate in response to a clock signal. An operation amplifier, a sub A/D converter, a D/A converter, and an operation amplifier in a second stage circuit operate in response to a clock signal having a frequency three times as high as that of the first clock signal. An analog signal output from the operational amplifier in the first stage is applied to an input node in the second stage circuit through a switch. An analog signal output from an operational amplifier in the second stage circuit is applied to an input node in the second stage circuit through a switch.

13 Claims, 12 Drawing Sheets

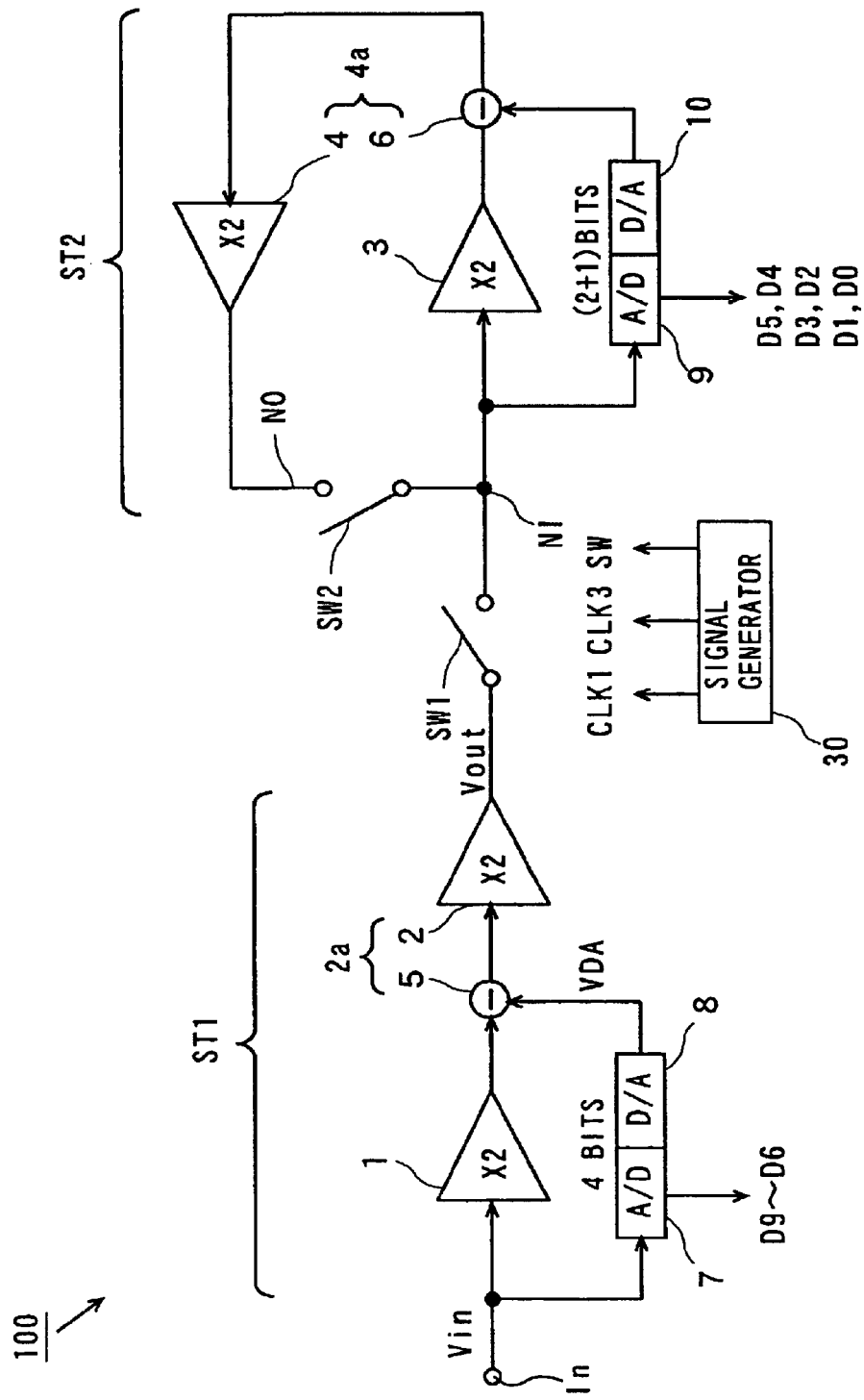
F I G. 1

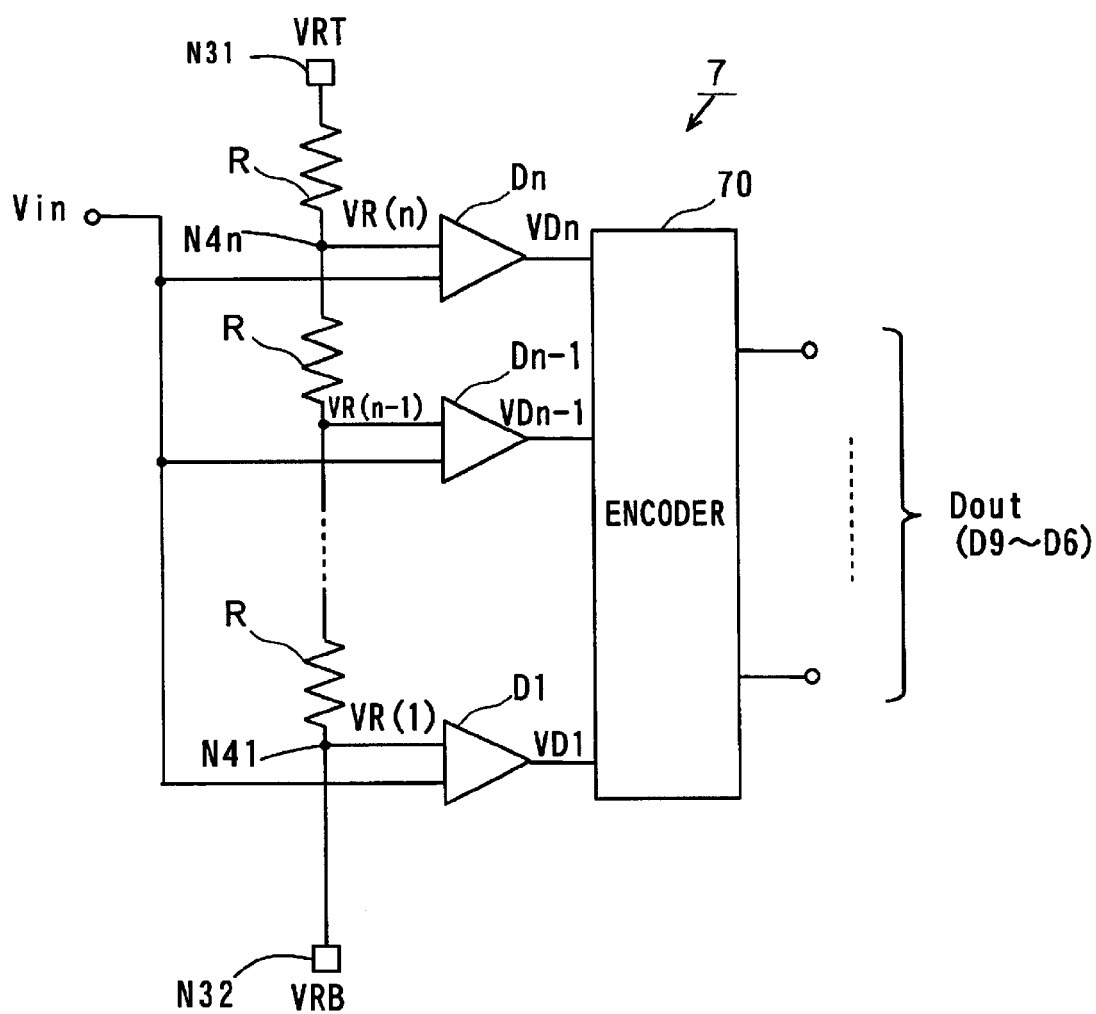
F I G. 8

F I G. 9
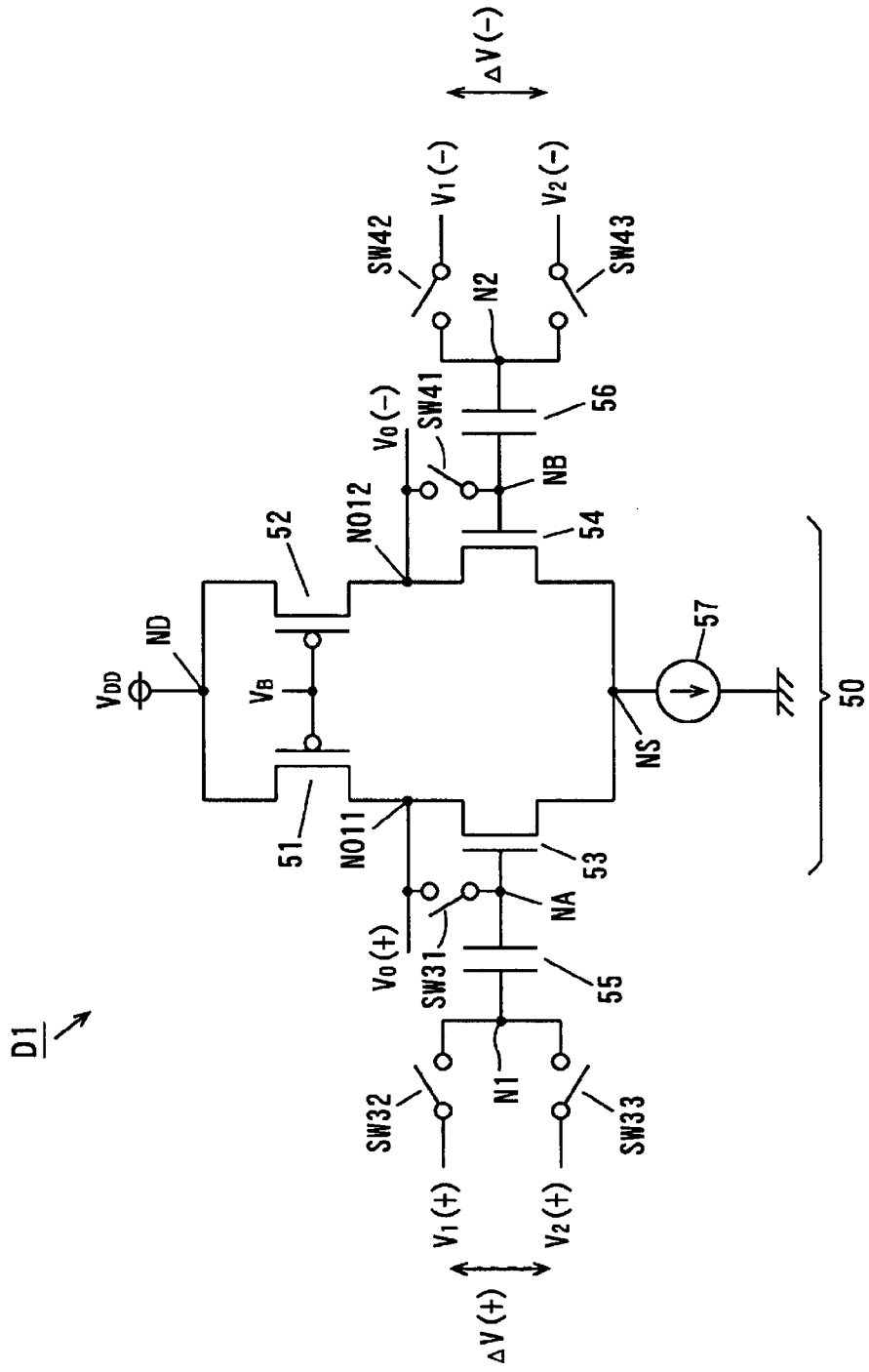

ANALOG-DIGITAL CONVERSION CIRCUIT

BACKGROUND OF THE INVENTION

1. Field of the Invention

The present invention relates to an analog-digital conversion circuit having a multi-stage pipeline (step flush) structure.

2. Description of the Background Art

In recent years, with the advent of advanced digital processing technology for video signals, there has been a growing demand for digital-analog conversion circuits (A/D converters) for processing video signals. Since the analog-digital conversion circuit for processing video signals must operate at high speed, a two-step flush (a two-step parallel) method has been widely employed for conventional analog-digital conversion circuits.

As the number of bits to convert has increased, however, sufficient conversion accuracy can no longer be obtained by the two-step flush method, and therefore an analog-digital conversion circuit having a multi-stage pipeline (step flush) structure has been developed. (See, for example, Japanese Patent Laid-Open No. 11-88172).

FIG. 12 is a block diagram of a conventional analog-digital conversion circuit. The analog-digital conversion circuit 101 in FIG. 12 has a 10-bit, four-stage pipeline structure.

In FIG. 12, the analog-digital conversion circuit 101 includes a sample-hold circuit 102, first to fourth stage circuits 103 to 106, a plurality of latch circuits 107, and an output circuit 108.

The first stage circuit 103 includes a sub A/D converter 109, a D/A converter 110, an operational amplifier 111a, a subtraction circuit 112, and an operational amplifier 113. The subtraction circuit 112 and the operational amplifier 113 form a differential amplifier 114. The second and third stage circuits 104 and 105 each include a sub A/D converter 109, a D/A converter 110, an operational amplifier 111, a subtraction circuit 112, and an operational amplifier 113. In the first to third stage circuits 103 to 105, the subtraction circuit 112 and the operational amplifier 113 form a differential amplifier 114.

Note however that, as will be described, the operational amplifier 111a in the first stage circuit 103 has a gain of 1 and serves as a sample-hold circuit. The operational amplifier 113 in the first stage circuit 103 and the operational amplifiers 111 and 113 in the second and third stage circuits 104 and 105 each have a gain of 2. The fourth (final) stage circuit 106 includes only a sub A/D converter 109.

The first stage circuit 103 has a 4-bit structure, and the second to fourth stage circuits 104 to 106 each have a 2-bit structure. In the first to third stage circuits 103 to 105, the number of bits (bit structure) for the sub A/D converter 109 and the D/A converter 110 are set to be equal.

Now, the operation of the analog-digital conversion circuit 101 in FIG. 12 will be described. The sample-hold circuit 102 samples an analog input signal Vin and holds the signal for a prescribed time period. The analog input signal Vin output from the sample-hold circuit 102 is transferred to the first stage circuit 103.

In the first stage circuit 103, the sub A/D converter 109 A/D-converts the analog input signal Vin. The result of A/D conversion by the sub A/D converter 109, a digital output of the high order 4 bits ($2^9$, $2^8$, $2^7$, $2^6$) is transferred to the D/A converter 110 and also transferred to the output circuit 108 through the four latch circuits 107. The D/A converter 110 converts the result of A/D conversion by the sub A/D converter 109, the 4-bit digital output into an analog signal.

Meanwhile, the operational amplifier 111a samples the analog input signal Vin and holds the signal for a prescribed period. The subtraction circuit 112 subtracts between the analog input signal Vin output from the operational amplifier 111a and the D/A conversion result by the D/A converter 110. The operational amplifier 113 amplifies the output of the subtraction circuit 112. The output of the operational amplifier 113 is transferred to the second stage circuit 104.

In the second stage circuit 104, the sub A/D converter 109 A/D-converts the output from the operational amplifier 113 in the first stage circuit 103. The A/D conversion result by the sub A/D converter 109 is transferred to the D/A converter 110 and also transferred to the output circuit 108 through the three latch circuits 107. In this way, a digital output of intermediate high order 2 bits ($2^5$, $2^4$) is obtained from the second stage circuit 104.

Meanwhile, the operational amplifier 111 amplifies the output from the operational amplifier 113 in the first stage circuit 103. The subtraction circuit 112 subtracts between the output of the operational amplifier 111 and the D/A conversion result by the D/A converter 110. The operational amplifier 113 amplifies the output of the subtraction circuit 112. The output of the operational amplifier 113 is transferred to the third stage circuit 105.

In the third stage circuit 105, the operation same as that in the second stage circuit 104 is carried out to the output from the operational amplifier 113 in the second stage circuit 104. In this way, a digital output of the intermediate low order 2 bits ($2^3$, $2^2$) is obtained from the third stage circuit 105.

In the fourth circuit 106, the sub A/D converter 109 A/D-converts the output from the operational amplifier 113 in the third stage circuit 105, and a digital output of the low order 2 bits ($2^1$, $2^0$) is obtained.

The digital outputs of the first to fourth stage circuits 103 to 106 simultaneously reach the output circuit 108 through the latch circuits 107. More specifically, the latch circuits 107 are provided for synchronization among the digital outputs of the circuits 103 to 106.

The output circuit 108 carries out digital correction to a 10-bit digital output Dout corresponding to the analog input signal Vin if necessary and then outputs the corrected output in parallel.

In this way, in the analog-digital conversion circuit having a multi-stage pipeline structure, the pipeline processing and amplifying function in the multiple stages allow high speed throughput (conversion frequency) and high accuracy (high resolution) to be achieved. Therefore, 8- to 12-bit structure, analog-digital conversion circuits operating with high accuracy at high speed and a conversion frequency in the range from several MHz to 100 MHz are widely used for digital video signal processing, digital communication processing and the like.

However, in the analog-digital conversion circuit having the above described multi-stage pipeline structure, the area efficiency cannot be high.

SUMMARY OF THE INVENTION

It is an object of the invention to provide an analog-digital conversion circuit having a reduced area.

An analog-digital conversion circuit according to one aspect of the invention includes a first circuit having first and second nodes, a selector that selectively applies one of an input analog signal and an analog signal at the second node to the first node, and a control device that controls the selector. The first circuit includes a first analog-digital converter that converts an analog signal from the first node into a digital signal, a first digital-analog converter that converts the digital signal output from the first analog-digital converter into an analog signal, and a first differential amplifier that amplifies the difference between the analog signal from the first node and the analog signal output from the first digital-analog converter and outputs the amplified difference to the second node. The control device controls the selector so that after the input analog signal is applied to the first node, conversion operation by the first analog-digital converter, conversion operation by the first digital-analog converter, and amplifying operation by the first differential amplifier are carried out for a prescribed number of cycles.

In the analog-digital conversion circuit according to the invention, after the input analog signal is applied to the first node, conversion operation by the first analog-digital converter, conversion operation by the first digital-analog converter, and amplifying operation by the first differential amplifier are carried out in the first circuit for a prescribed number of cycles. In this way, a digital signal is sequentially output from the first analog-digital converter in the first circuit in each of the cycles.

In this way, repeated uses of the first circuit allows a proceeding equivalent to a multi-stage pipeline structure to be formed. Consequently, the necessary area can be reduced.

In addition, the number of cycles in the first circuit can be changed by controlling the selector, and therefore the bit resolution can readily be changed. Therefore, an analog-digital conversion circuit having variable bit resolution can readily be formed with the same hardware structure.

The first circuit may further include a first operational amplifier that amplifies the analog signal at the first node and applies the amplified signal to the first differential amplifier.

In this case, the first operational amplifier and the first differential amplifier in the first circuit can reduce the loop constant for the amplifiers for each stage, and the load capacitance of the amplifiers for each stage can be reduced. In this way, the limit operation frequency of each amplifier increases. Consequently, without having to improve the performance of the amplifiers, high conversion operation can be maintained while the conversion speed can be improved.

Furthermore, in each of the cycles in the first circuit, amplifying operation by the first operational amplifier and conversion operation by the first analog-digital converter can be carried out in parallel with amplifying operation by the first differential amplifier and conversion operation by the first digital analog converter. In this way, the timing limitations for the amplifying operation by the first operational amplifier, the conversion operation by the first analog-digital converter, the conversion operation by the first digital-analog converter, and the amplifying operation by the first differential amplifier in each cycle can be relaxed.

The analog-digital conversion circuit may further include a second circuit provided preceding the first circuit by at least one stage through the selector. The second circuit may include a second analog-digital converter that converts an input analog signal into a digital signal, a second digital-analog converter that converts a digital signal output from the second analog-digital converter into an analog signal, and a second differential amplifier that amplifies the difference between the input analog signal and the analog signal output from the second digital-analog converter and outputs the amplified difference to the first circuit through the selector.

In this case, as the analog signal is input to the second circuit, conversion operation by the second analog-digital converter, conversion operation by the second digital analog converter, and amplifying operation by the second differential amplifier are carried out. The analog signal output from the second differential amplifier is input to the first circuit through the selector, and in the first circuit, conversion operation by the first analog-digital converter, conversion operation by the first digital-analog converter, and amplifying operation by the first differential amplifier are carried out for a prescribed number of cycles. In this way, the digital signal is output from the second analog-digital converter in the second circuit, and a digital signal is sequentially output from the first analog-digital converter in the first circuit for each of the cycles.

In this manner, the parallel operation of he second and first circuits form a multi-stage pipeline structure.

The second circuit may further include a second operational amplifier that amplifies the input analog signal and applies the amplified signal to the second differential amplifier.

In this case, the second operational amplifier and the second differential amplifier in the second circuit allow the loop constant for the amplifiers for each stage to be reduced, and the load capacitance for the amplifiers for each stage can be reduced. This increases the limit operation frequency for each amplifier. Consequently, without having to increase the performance of the amplifiers, high conversion operation can be maintained, and the conversion speed can be improved.

Furthermore, in the second circuit, amplifying operation by the second operational amplifier, and conversion operation by the second analog-digital converter can be carried out in parallel with amplifying operation by the second differential amplifier and conversion operation by the second digital-analog converter. Consequently, in the second circuit, the timing limitations for the amplifying operation by the second operational amplifier, the conversion operation by the second analog-digital converter, the conversion operation by the second digital-analog converter, and the amplifying operation by the second differential amplifier can be relaxed The control device may include a signal generator that generates a clock signal and a control signal. The first analog-digital converter, the first digital-analog converter, and the first differential amplifier in the first circuit operate in response to the clock signal generated by the signal generator. The selector responds to the control signal generated by the signal generator to select between a state in which the input analog signal is applied to the first node and a state in which the analog signal at the second node is applied to the first node.

In this case, the first analog-digital converter, the first digital-analog converter, and the first differential amplifier in the first circuit operate in response to the clock signal. The selector responds to the control signal to select between a state in which the input analog signal is applied to the first node and a state in which the analog signal at the second node is applied to the first node. Consequently, in the first circuit, the conversion operation by the first analog-digital converter, the conversion operation by the first digital-analog converter, and the amplifying operation by the first differential amplifier are carried out for a prescribed cycles, and thus a multi-stage pipeline structure is formed.

The control signal may have a first frequency and the clock signal may have a second frequency that is an integral multiple of the first frequency.

The control device may further include a changing device for changing the frequency of the clock signal generated by the signal generator.

In this case, the changing device changes the frequency of the clock signal, so that the number of cycles in the first circuit can readily be changed. Consequently, the bit resolution can readily be changed.

The signal generator may include a phase-locked loop having a frequency divider, and the changing device may include a frequency dividing factor setting device for setting a frequency dividing factor by the frequency divider in the phase-locked loop.

In this case, the frequency dividing factor setting device sets a frequency dividing factor by the frequency divider in the phase locked loop, so that the frequency of the clock signal can readily be changed and thus the bit resolution can be changed.

The control device may include a signal generator that generates first and second clock signals and a control signal. The first analog-digital converter, the first digital-analog converter, and the differential amplifier in the first circuit may operate in response to the first clock signal generated by the signal generator. The second analog-digital converter, the second digital-analog converter, and second differential amplifier in the second circuit may operate in response to the second clock signal generated by the signal generator. The selector may respond to the control signal generated by the signal generator to select between a state in which the analog signal output from the first differential amplifier in the first circuit is applied to the first node and a state in which the analog signal at the second node is applied to the first node.

In this case, the first analog-digital converter, the first digital-analog converter, and the first differential amplifier in the first circuit operate in response to the first clock signal, and the second analog-digital converter, the second digital-analog converter, and the second differential amplifier in the second circuit operate in response to the second clock signal. The selector responds to the control signal to select between a state in which the analog signal output from the first differential amplifier in the first circuit is applied to the first node, and a state in which the analog signal at the second node is applied to the first node. In this way, conversion operation by the second analog-digital converter, in parallel with conversion operation by the second digital-analog converter, and amplifying operation by the second differential amplifier in the second circuit, conversion operation by the first analog-digital converter, conversion operation by the first digital-analog converter, and amplifying operation by the first differential amplifier are carried out in the first circuit for a prescribed number of cycles, and thus a multi-stage pipeline structure is formed.

The control signal may have a first frequency, the first clock signal may have a second frequency that is an integral multiple of the first frequency, and the second clock signal may have the first frequency.

The control device may further include a changing device that changes the frequency of the first clock signal generated by the signal generator.

In this case, the number of cycles in the first circuit can readily be changed by changing the frequency of the first clock signal by the changing device.

The signal generator may include a phase locked loop having a frequency divider, and the changing device may include a frequency dividing factor setting device that sets a frequency dividing factor by the frequency divider in the phase locked loop.

In this case, the frequency dividing factor by the frequency divider in the phase locked loop is set by the frequency dividing factor setting device, so that the frequency of the first clock signal can readily be changed and the bit resolution can be changed as well.

An analog-digital conversion method according to another aspect of the invention comprises an analog-digital conversion the steps of converting a first analog signal into a first digital signal, converting the first digital signal into a second analog signal, amplifying the difference between the first analog signal and the second analog signal to generate a third analog signal, converting the third analog signal into a second digital signal, converting the second digital signal into a fourth analog signal and amplifying the difference between the third analog signal and the fourth analog signal to generate a fifth analog signal, wherein the step of converting a first analog signal and the step of converting the third analog signal are carried out in a common analog-digital converter, the step of converting the first digital signal and the step of converting the second digital signal are carried out in a common digital-analog converter, and the step of amplifying the difference between the first analog signal and the second analog signal and the step of amplifying the difference between the third analog signal and the fourth analog signal are carried out in a same differential amplifier.

The foregoing and other objects, features, aspects, and advantages of the present invention will become more apparent from the following detailed description of the present invention when taken in conjunction with the accompanying drawings.

BRIEF DESCRIPTION OF THE DRAWINGS

FIG. 1 is a block diagram of the configuration of an analog-digital conversion circuit according to one embodiment of the invention;

FIG. 8 is a circuit diagram of the configuration of a sub A/D converter in the analog-digital conversion circuit in FIG. 1;

FIG. 9 is a circuit diagram of a differential voltage comparator used in the sub A/D converter in FIG. 8;

DESCRIPTION OF THE PREFERRED EMBODIMENTS

Figure 2:
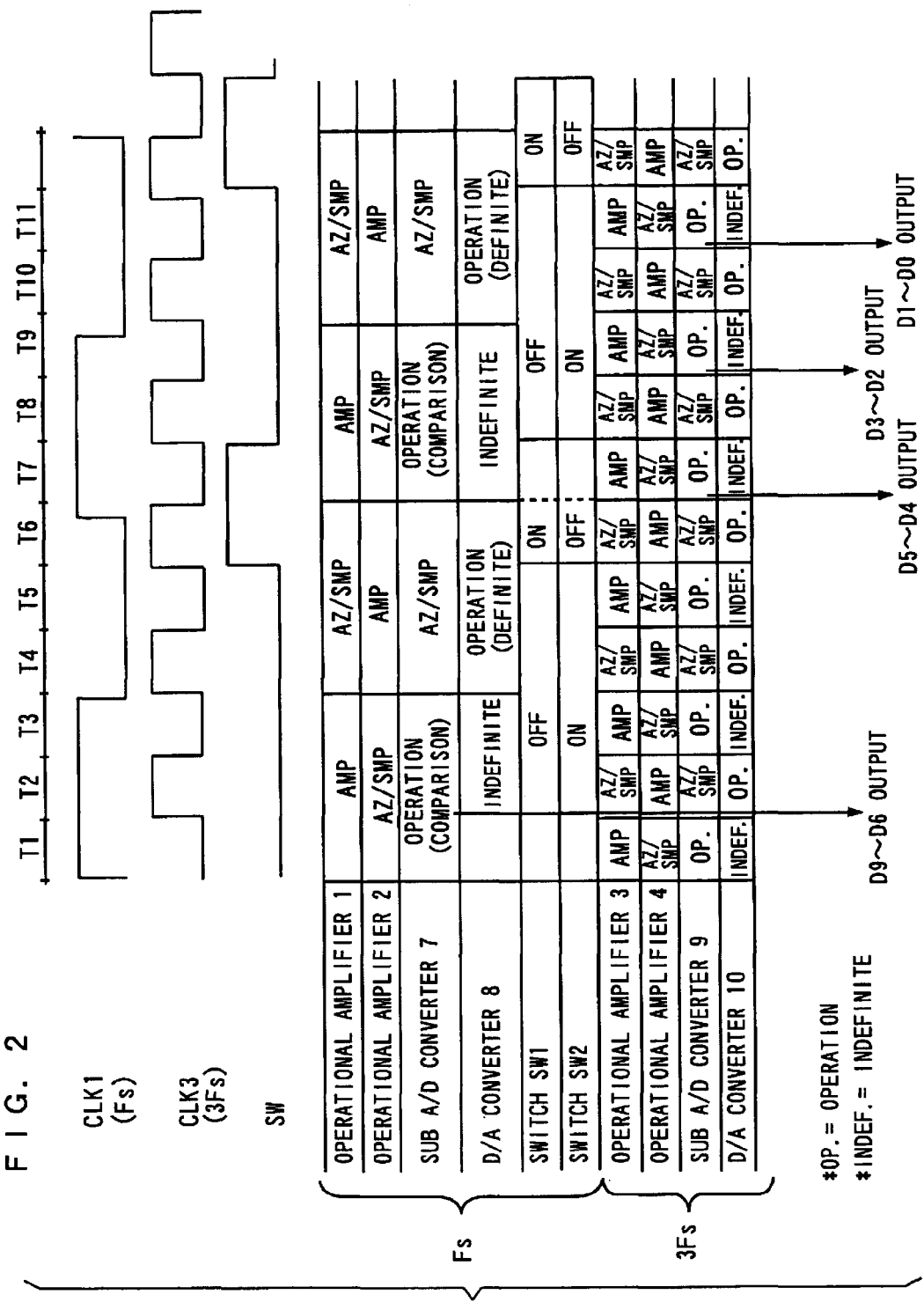
FIG. 2 is a timing chart for use in illustration of the operation of the analog-digital conversion circuit in FIG. 1.

FIG. 1 is a block diagram of the configuration of an analog-digital conversion circuit according to one embodiment of the invention.

The analog-digital conversion circuit 100 in FIG. 1 includes a first stage circuit ST1, a second stage circuit ST2, switches SW1 and SW2, and a signal generator 30.

The first stage circuit ST1 includes an operational amplifier 1, a sub A/D converter 7, a D/A converter 8, a subtraction circuit 5, and an operational amplifier 2. The subtraction circuit 5 and the operational amplifier 2 form a differential amplifier 2a. The second stage circuit ST2 includes an operational amplifier 3, a sub A/D converter 9, a D/A converter 10, a subtraction circuit 6, and an operational amplifier 4. The subtraction circuit 6 and the operational amplifier 4 form a differential amplifier 4a.

The operational amplifiers 1 and 2 in the first stage circuit ST1 and the operational amplifiers 3 and 4 in the second stage circuit ST2 each have a gain of 2. The operational amplifier 1 may have a gain of 1. The sub A/D converter 7 in the first stage circuit ST1 has a 4-bit structure, and the sub A/D converter 9 in the second stage circuit ST2 has a structure of (two bits+one redundant bit). The redundant bit will not be taken into account in the following description.

The signal generator 30 generates clock signals CLK1 and CLK3, and a control signal SW. The clock signal CLK1 has a frequency Fs, and the clock signal CLK3 has a frequency three times as high as the frequency Fs of the clock signal CLK1, i.e. 3Fs. The control signal SW has a frequency equal to the frequency Fs of the clock signal CLK1.

The operational amplifier 1, the sub A/D converter 7, the D/A converter 8, and the operational amplifier 2 in the first stage circuit ST1 operate in response to the clock signal CLK1. The operational amplifier 3, the sub A/D converter 9, the D/A converter 10, and the operational amplifier 4 in the second stage circuit ST2 operate in response to the clock signal CLK3. The switches SW1 and SW2 turn on and off in a complimentary manner to each other in response to the control signal SW.

An analog signal Vin is applied to an input terminal In. The analog signal Vin at the input terminal In is input to the operational amplifier 1 and the sub A/D converter 7 in the first stage circuit ST1. The sub A/D converter 7 A/D-converts the analog signal Vin, outputs a 4-bit digital signal as the result of A/D conversion, and also applies the digital signal to the D/A converter 8. The D/A converter 8 D/A-converts the 4-bit digital signal applied from the sub A/D converter 7 and outputs an analog signal VDA.

Meanwhile, the operational amplifier 1 samples and amplifies the analog signal Vin at the input terminal In for output. The subtraction circuit 5 subtracts between the analog signal Vin output from the operational amplifier 1 and the analog signal VDA output from the D/A converter 8. The operational amplifier 2 amplifies the output signal from the subtraction circuit 5 and outputs the amplified signal as an analog signal Vout. The analog signal Vout output from the operational amplifier 2 is applied to an input node NI in the second stage circuit ST2 when the switch SW1 is in an on state.

The analog signal at the input node NI is input to the operational amplifier 3 and the sub A/D converter 9 in the second stage circuit ST2. The sub A/D converter 9 A/D-converts the analog signal, outputs a 2-bit digital signal as the result of A/D conversion, and also applies the digital signal to the D/A converter 10. The D/A converter 10 D/A-converts the 2-bit digital signal applied from the sub A/D converter 9 and outputs a resulting analog signal.

Meanwhile, the operational amplifier 3 samples and amplifies the analog signal at the input node N1 for output. The subtraction circuit 6 subtracts between the analog signal output from the operational amplifier 3 and the analog signal output from the D/A converter 10. The operational amplifier 4 amplifies the output signal from the subtraction circuit 6 and outputs a resulting analog signal. The analog signal output from the operational amplifier 4 is applied to the input node NI when the switch SW2 is in an on state.

According to the embodiment, the second stage circuit ST2 corresponds to the first circuit, and the first stage circuit ST1 corresponds to the second circuit. The switches SW1 and SW2 correspond to the selector, and the signal generator 30 corresponds to the control device. The sub A/D converter 9 corresponds to the first analog-digital converter, the D/A converter 10 to the first digital-analog converter, the operational amplifier 3 to the first operational amplifier, and the differential amplifier 4a to the first differential amplifier. The sub analog-digital converter 7 corresponds to the second analog-digital converter, the D/A converter 8 to the second digital-analog converter, the operational amplifier 1 to the second operational amplifier, and the differential amplifier 2a to the second differential amplifier.

With reference to FIG. 2, the general operation of the analog-digital conversion circuit 100 in FIG. 1 will be described. FIG. 2 is a timing chart for use in illustration of the operation of the analog-digital conversion circuit 100 in FIG. 1.

In FIG. 2, AMP represents amplifying operation, AZ auto zero operation, and SMP sampling operation. Herein, the auto zero operation is the operation of nullifying the potential difference between the pair of input terminals of an operational amplifier.

In periods T1 to T5, the control signal SW attains a low level. This turns off the switch SW1 and turns on the switch SW2.

In the periods T1 to T3, the clock signal CLK1 attains a high level. Then, the operational amplifier 1 in the first stage circuit ST1 carries out amplifying operation. The sub A/D converter 7 carries out A/D conversion operation. In this way, the sub A/D converter 7 outputs digital signals D9 to D6 of the high order 4 bits. At the time, the operational amplifier 2 carries out auto zero operation or sampling operation. The output of the D/A converter 8 is indefinite.

Then, in periods T4 to T6, the clock signal CLK1 attains a low level. This causes the operational amplifier 1 in the first stage circuit ST1 to carry out auto zero operation and sampling operation and the sub A/D converter 7 to carry out auto zero operation and sampling operation. At the time, the operational amplifier 2 carries out amplifying operation and the D/A converter 8 carries out D/A conversion operation. The analog signal output from the D/A converter 8 is definite.

In periods T6 and T7, the control signal SW attains a high level. This turns on the switch SW1 and turns off the switch SW2. Consequently, the analog signal output from the operational amplifier 2 in the first stage circuit ST1 is applied to the input node NI in the second stage circuit ST2 through the switch SW1.

Next, the operation of the second stage circuit ST2 will be described. In the period T6, the clock signal CLK3 attains a high level. This causes the operational amplifier 3 in the second stage circuit ST2 to carry out auto zero operation and sampling operation, and the sub A/D converter 9 to carry out auto zero operation and sampling operation. At the time, the operational amplifier 4 carries out amplifying operation, and the D/A converter 10 carries out D/A conversion operation.

Then, in the period T7, the clock signal CLK3 attains a low level. This causes the operational amplifier 3 in the second stage circuit ST2 to carry out amplifying operation and the sub A/D converter 9 to carry out A/D conversion operation. In this case, digital signals D5 and D4 of the intermediate high order 2 bits are output from the sub A/D converter 9. At the time, the operational amplifier 4 carries out auto zero operation and sampling operation, and the output of the D/A converter 10 is indefinite.

In periods T8 to T11, the control signal SW attains a low level. This turns off the switch SW1, and turns on the switch SW2. Consequently, the analog signal output from the operational amplifier 4 in the second stage circuit ST2 to the output node NO is applied to the input node NI through the switch SW2.

In the period T8, the clock signal CLK3 attains a high level. This causes the operational amplifier 3 in the second stage circuit ST2 to carry out auto zero operation and sampling operation, and the sub A/D converter 9 to carry out auto zero operation and sampling operation. At the time, the operational amplifier 4 carries out amplifying operation, and the D/A converter 10 carries out D/A conversion operation. Consequently, the analog signal output from the operational amplifier 4 to the output node NO is applied to the node NI through the switch SW2.

Then, in the period T9, the clock signal CLK3 attains a low level. This causes the operational amplifier 3 in the second stage circuit ST2 to carry out amplifying operation, and the sub A/D converter 9 to carry out A/D conversion operation. In this case, digital signals D3 and D2 of the intermediate low order 2 bits are output from the A/D converter 9. At the time, the operational amplifier 4 carries out auto zero operation and sampling operation, and the output of the D/A converter 10 is indefinite.

In the period T10, the clock signal CLK3 attains a high level. This causes the operational amplifier 3 in the second stage circuit ST2 to carry out auto zero operation and sampling operation and the sub A/D converter 9 to carry out auto zero operation and sampling operation. At the time, the operational amplifier 4 carries out amplifying operation, and the D/A converter 10 carries out D/A conversion operation. Consequently, the analog signal output to the output node NO from the operational amplifier 4 is applied to the input node NI through the switch SW2.

Then, in the period T11, the clock signal CLK3 attains a low level. The operational amplifier 3 in the second stage circuit ST2 carries out amplifying operation, and the sub A/D converter 9 carries out A/D conversion operation. In this case, digital signals D1 and D0 of the low order 2 bits are output from the sub A/D converter 9. At the time, the operational amplifier 4 carries out auto zero operation and sampling operation, and the output of the D/A converter 10 is indefinite.

As described above, in the analog-digital conversion circuit 100 according to the embodiment, the digital signals D9 to D6 of the high order 4 bits are output from the first stage circuit ST1. The digital signals D5 and D4 of the intermediate high order 2 bits, the digital signals D3 and D2 of the intermediate low order 2 bits, and the digital signals D1 and D0 of the low order 2 bits are sequentially output from the second stage circuit ST2. In this way, the 10-bit, four-stage pipeline structure is made of the two stages of circuits ST1 and ST2. Consequently, the necessary area is reduced.

Figure 3:
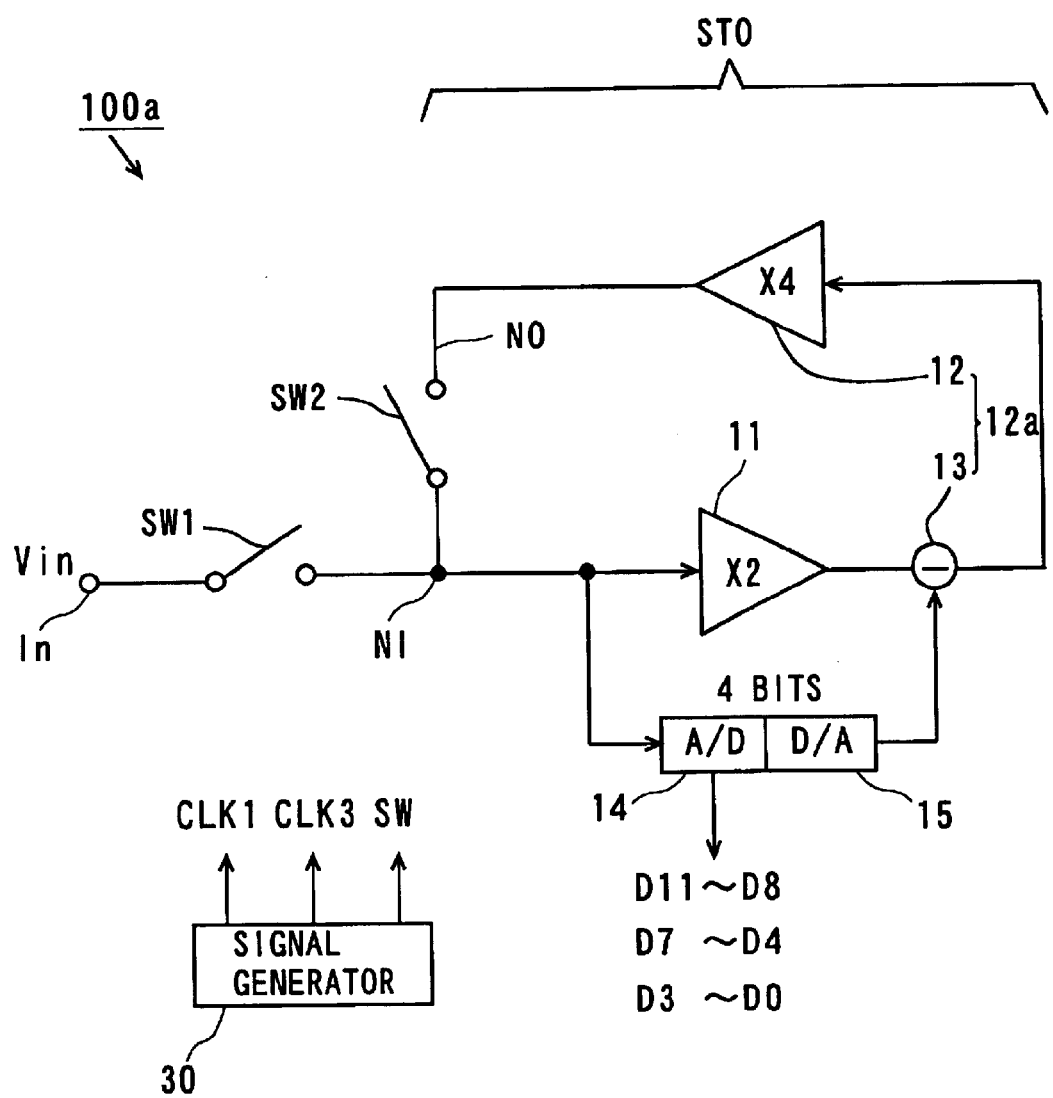
FIG. 3 is a block diagram of the configuration of an analog-digital conversion circuit according to another embodiment of the invention.

FIG. 3 is a block diagram of the configuration of an analog-digital conversion circuit according to another embodiment of the invention.

The analog-digital conversion circuit 100a in FIG. 3 includes a circuit ST0, switches SW1 and SW2, and a signal generator 30.

The circuit ST0 includes an operational amplifier 11, a sub A/D converter 14, a D/A converter 15, a subtraction circuit 13, and an operational amplifier 12. The subtraction circuit 13 and the operational amplifier 12 form a differential amplifier 12a.

The operational amplifiers 11 and 12 in the circuit ST0 each have a gain of 4. The sub A/D converter 14 in the circuit ST0 has a 4-bit structure.

The signal generator 30 generates clock signals CLK1 and CLK3, and a control signal SW. The clock signal CLK1 has a frequency Fs, and the clock signal CLK3 has a frequency 3Fs, i.e., a frequency three times as high as the frequency Fs of the clock signal CLK1. The control signal SW has a frequency equal to the frequency Fs of the clock signal CLK1.

The operational amplifier 11, the sub A/D converter 14, the D/A converter 15, and the operational amplifier 12 in the circuit ST0 operate in response to the clock signal CLK3. The switches SW1 and SW2 turn on and off in a complimentary manner to each other in response to the control signal SW.

An analog signal Vin is applied to the input terminal In. The analog signal Vin at the input terminal In is input to the operational amplifier 11 and the sub A/D converter 14 in the circuit ST0 when the switch SW1 is in an on state. The sub A/D converter 14 A/D-converts the analog signal Vin, outputs a 4-bit digital signal as the result of A/D conversion, and also applies the digital signal to the D/A converter 15. The D/A converter 15 D/A-converts the 4-bit digital signal applied from the sub A/D converter 14 and outputs a resulting analog signal.

Meanwhile, the operational amplifier 11 samples and amplifies the analog signal at the input node NI for output. The subtraction circuit 13 subtracts between the analog signal output from the operational amplifier 11 and the analog signal output from the D/A converter 15. The operational amplifier 12 amplifies the output signal from the subtraction circuit 13 and outputs a resulting analog signal. The analog signal output from the operational amplifier 12 is applied to the input node NI when the switch SW2 is in an on state.

According to the embodiment, the circuit ST0 corresponds to the first circuit, and the switches SW1 and SW2 correspond to the selector. The signal generator 30 corresponds to the control device. The sub A/D converter 14 corresponds to the first analog-digital converter, the D/A converter 15 to the first digital-analog converter, the operational amplifier 11 to the first operational amplifier, and the differential amplifier 12a to the first differential amplifier.

Figure 4:
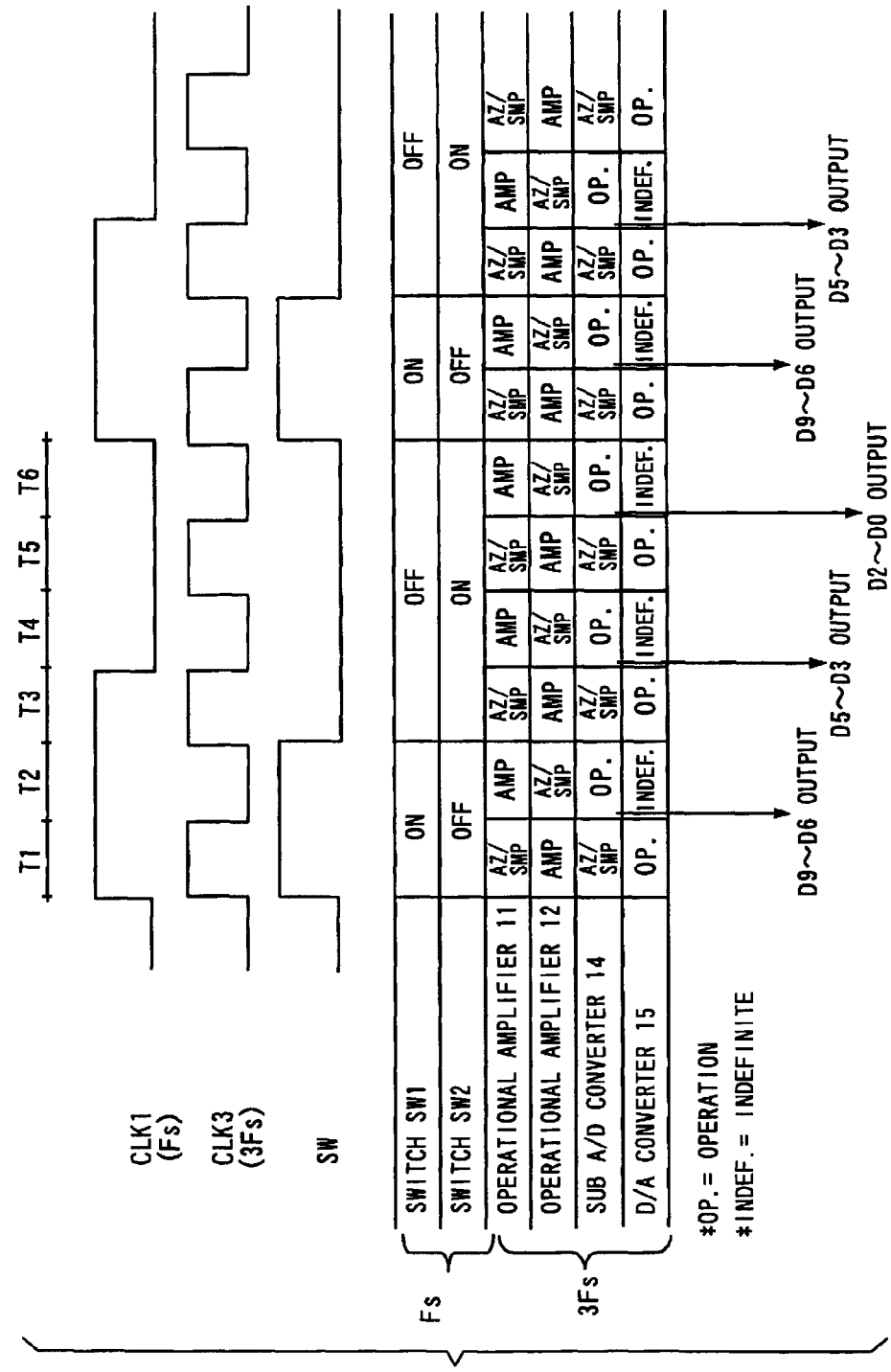
FIG. 4 is a timing chart for use in illustration of the operation of the analog-digital conversion circuit in FIG. 3.

With reference to FIG. 4, the general operation of the analog-digital conversion circuit 100a in FIG. 3 will be described. FIG. 4 is a timing chart for use in illustration of the operation of the analog-digital conversion circuit 110a in FIG. 3.

In FIG. 4, AMP represents amplifying operation, AZ auto zero operation, and SMP sampling operation.

In periods T1 and T2, the control signal SW attains a high level. This turns on the switch SW1 and turns off the switch SW2. Therefore, the analog signal Vin applied to the input terminal In is applied to the input node NI through the switch SW1.

In the periods T1, the clock signal CLK3 attains a high level. This causes the operational amplifier 11 in the circuit ST0 to carry out auto zero operation and sampling operation. The sub A/D converter 14 carries out auto zero operation and sampling operation. At the time, the operational amplifier 12 carries out amplifying operation. The output of the D/A converter 15 is indefinite.

Then, in the period T2, the clock signal CLK3 attains a low level. This causes the operational amplifier 11 in the circuit ST0 to carry out amplifying operation, and the sub A/D converter 14 to carry out A/D conversion operation. In this case, digital signals D9 to D6 of the high order 4 bits are output from the sub A/D converter 14.

In periods T3 to T6, the control signal SW attains a high level. This turns off the switch SW1 and turns on the switch SW2. Consequently, the analog signal output from the operational amplifier 12 to the output node NO is applied to the input node NI through the switch SW2.

In the period T3, the clock signal CLK3 attains a high level. This causes the operational amplifier 11 in the circuit ST0 to carry out auto zero operation and sampling operation, and the sub A/D converter 14 to carry out auto zero operation and sampling operation. At the time, the operational amplifier 12 carries out amplifying operation, and the D/A converter 15 carries out D/A conversion operation. As a result, the analog signal output to the output node NO from the operational amplifier 12 is applied to the input node NI through the switch SW2.

Then, in the period T4, the clock signal CLK3 attains a low level. This causes the operational amplifier 11 in the circuit ST0 to carry out amplifying operation and the sub A/D converter 14 to carry out A/D conversion operation. In this case, digital signals D5 to D3 of the intermediate order 3 bits and one redundant bit are output from the sub A/D converter 14. At the time, the operational amplifier 12 carries out auto zero operation and sampling operation, and the output of the D/A converter 15 is indefinite.

In the period T5, the clock signal CLK3 attains a high level. This causes the operational amplifier 11 in the circuit ST0 to carry out auto zero operation and sampling operation. The sub A/D converter 14 carries out auto zero operation and sampling operation. At the time, the operational amplifier 12 carries out amplifying operation, and the D/A converter 15 carries out D/A conversion operation. Consequently, the analog signal output from the operational amplifier 12 to the output node NO is applied to the input node NI through the switch SW2.

In the period T6, the clock signal CLK3 attains a low level. This causes the operational amplifier 11 in the circuit ST0 to carry out amplifying operation, and the sub A/D converter 14 to carry out A/D conversion operation. At the time, digital signals D2 to D0 of the low order 3 bits and one redundant bit are output from the sub A/D converter 14. At the time, the operational amplifier 12 carries out auto zero operation and sampling operation, and the output of the D/A converter 15 is indefinite.

As described above, in the analog-digital conversion circuit 100a according to the embodiment, the digital signals D9 to D6 of the high order 4 bits, the digital signals D5 to D3 of the intermediate order 3 bits, and the digital signals D2 to D0 of the low order 3 bits are sequentially output from the single circuit ST0. In this way, the 10-bit, three-stage pipeline structure is made of the single stage circuit ST0. Consequently, the necessary area is reduced.

According to the above described embodiment, the circuits ST1, ST2, and ST0 in the corresponding stages, the pairs of operational amplifiers 1 and 2, 3 and 4, and 11 and 12 are provided, respectively. Meanwhile, a single operational amplifier or three or more operational amplifiers may be provided in the circuit in each stage.

Figure 5:
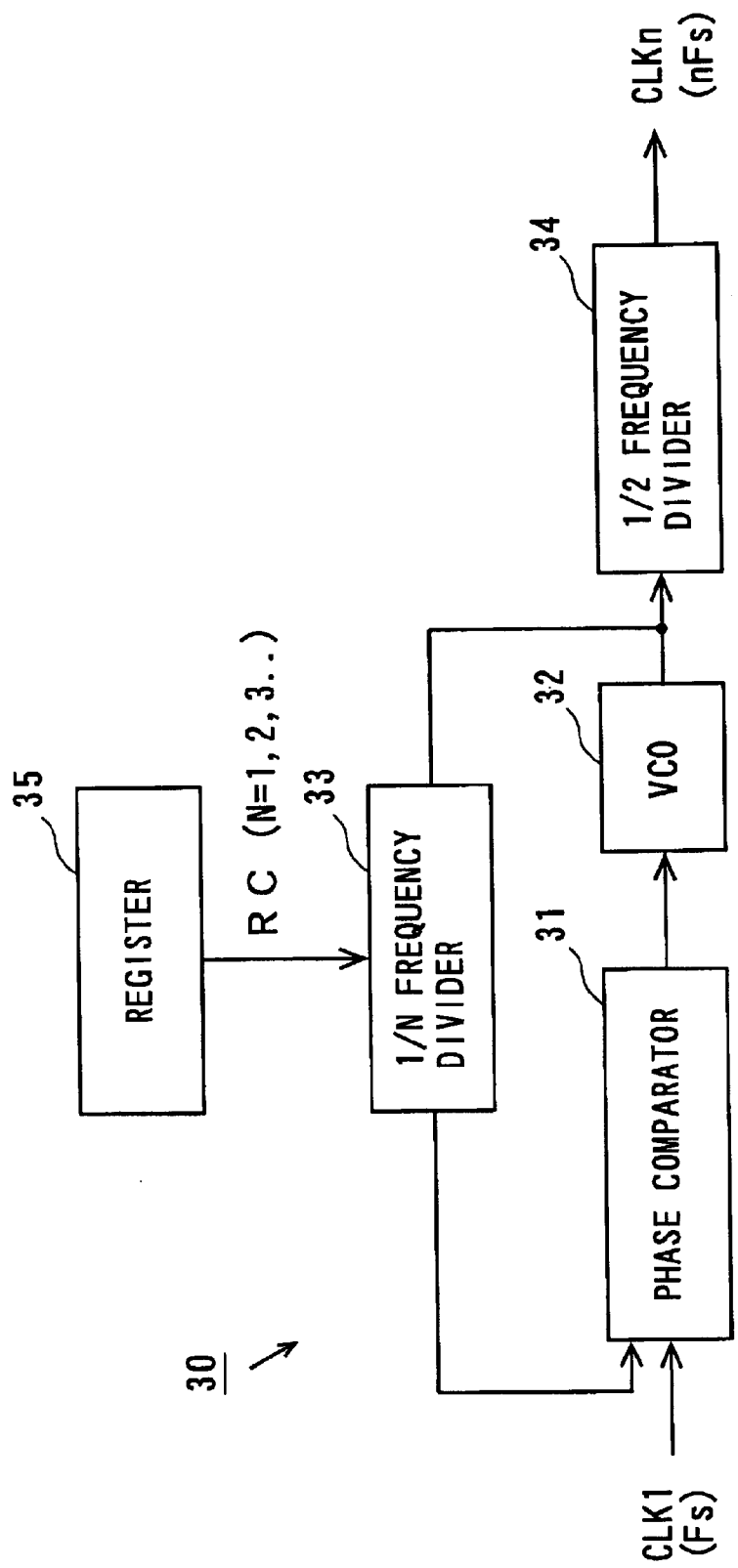
FIG. 5 is a block diagram of the configuration of a main part of a signal generator in the analog-digital conversion circuit in FIGS. 1 and 3.

FIG. 5 is a block diagram of the configuration of a main part of the signal generator 30 in the analog-digital conversion circuits 100 and 100a in FIGS. 1 and 3, respectively.

The signal generator 30 in FIG. 5 includes a phase comparator 31, a VCO (Voltage-Controlled Oscillator) 32, a 1/N frequency divider 33, a ½ frequency divider 34, and a register 35. The register 35 stores a value N in advance. Herein, the value N is an arbitrary positive integer. A control signal RC to set the value N is applied to the 1/N frequency divider 33 from the register 35.

The phase comparator 31 compares the phase of the clock signal CLK1 at a frequency Fs and the phase of the output signal of the 1/N frequency divider 33, and applies control voltage corresponding to the phase difference to the VCO 32. The VCO 32 outputs an oscillation signal having a frequency corresponding to the control voltage to the ½ frequency divider 34 and the 1/N frequency divider 33. The 1/N frequency divider 33 frequency-divides the oscillation signal output from the VCO 32 by N and applies the 1/N-frequency-divided oscillation signal to the phase comparator 31. The ½ frequency divider 34 frequency-divides the oscillation signal output from VCO 32 by 2 and outputs the ½ frequency-divided oscillation signal as a clock signal CLKn. The clock signal CLKn has a frequency nFs, i.e., a frequency n times as high as the frequency of the clock signal CKL1 (n=N/2).

For example, when N=2, N=4, N=6, and N=8 are set in the register of the 1/N frequency divider 33, the frequency of the clock signal CLKn is Fs, 2Fs, 3Fs, and 4Fs, respectively. Note that in the examples in FIGS. 1 and 3, N=6 is set.

In the analog-digital conversion circuit 100 in FIG. 1, when the value N in the 1/N frequency divider 33 is set to 2, so that the clock signal CLKn has a frequency Fs, the first stage circuit ST1 has a 4-bit structure, the second stage circuit ST2 has a structure of (two bits+one redundant bit), and thus a 6-bit pipeline structure is formed. When the value N in the 1/N frequency divider 33 is set to 4, so that the clock signal CLKn has a frequency 2Fs, the first stage circuit ST1 has a 4-bit structure, and the second stage circuit ST2 has a structure of (two bits+one redundant bit) in the first and second cycles. In this way, an 8-bit pipeline structure is formed. Furthermore, when the value N in the 1/N frequency divider 33 is set to 8, so that the clock signal CLKn has a frequency 4Fs, the first stage circuit ST1 has a 4-bit structure, and the second stage circuit ST2 has a structure of (two bits+one redundant bit) in the first to fourth cycles. In this way, a 12-bit pipeline structure is formed.

In the analog-digital conversion circuit 100a in FIG. 3, when the value N in the 1/N frequency divider 33 is set to 2, so that the clock signal CLKn has a frequency Fs, the circuit ST0 has a 4-bit structure, and a 4-bit pipeline structure is formed. When the value N in the 1/N frequency divider 33 is set to 4, so that the clock signal CLKn has a frequency 2Fs, the circuit ST0 has a 4-bit structure in the first cycle and a structure of (three bits+one redundant bit) in the second cycle, and a 7-bit pipeline structure is formed. Furthermore, when the value N in the 1/N frequency divider 33 is set to 8, so that the clock signal CLKn has a frequency 4Fs, the circuit ST0 has a 4-bit structure in the first cycle and a structure of (three bits+one redundant bit) in the second to fourth cycles. In this way, a 13-bit pipeline structure is formed.

In this manner, in the analog-digital conversion circuits 100 and 100a in FIGS. 1 and 3, respectively, the frequency dividing factor by the 1/N frequency divider 33 is arbitrarily set, so that the bit resolution can readily be changed. Consequently, an analog-digital conversion circuit having variable bit resolution can readily be implemented by the same hardware configuration.

Note that the phase comparator 31, the VCO 32, and the 1/N frequency divider 33 form a phase locked loop, and the 1/N frequency divider 33 corresponds to the frequency divider 33. The register 35 corresponds to the frequency dividing factor setting device.

Figure 6:
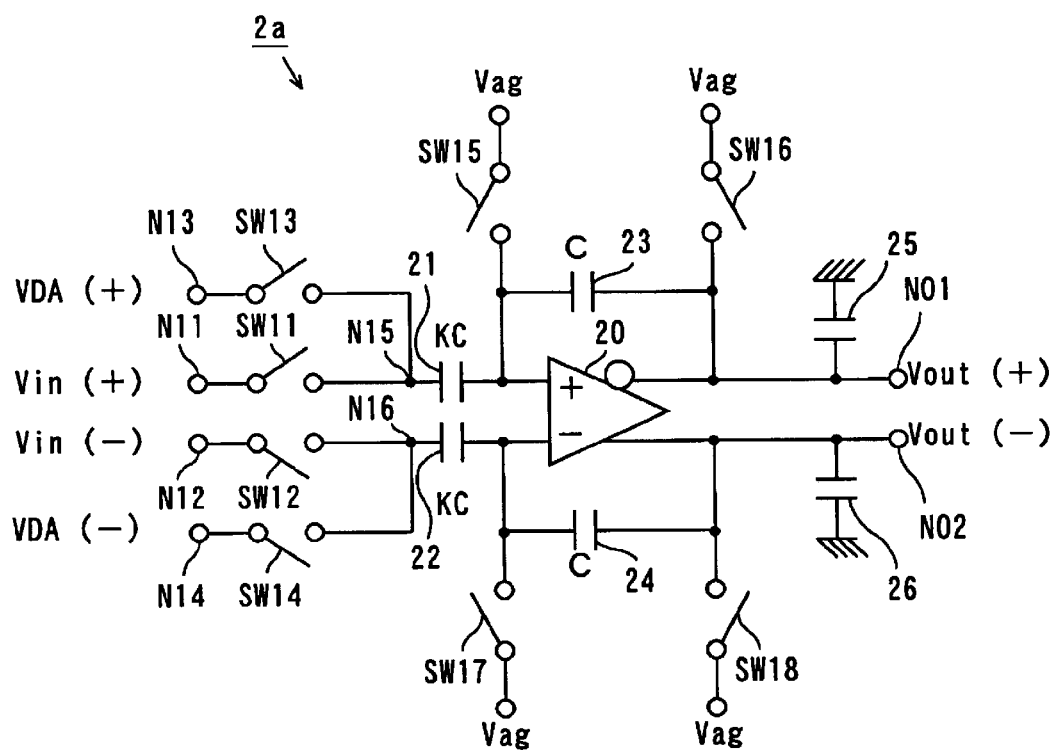
FIG. 6 is a circuit diagram of a differential amplifier in the analog-digital conversion circuit in FIG. 1.

FIG. 6 is a circuit diagram of a differential amplifier 2a in the analog-digital conversion circuit 100 in FIG. 1. Note that the differential amplifier 2a in FIG. 6 is a fully differential type, subtracting amplifying circuit.

In the differential amplifier 2a in FIG. 6, a capacitor 21 is connected between the non-inverting input terminal of the operational amplifier 20 and a node N15, and a capacitor 22 is connected between the inverting input terminal and a node N16.

The node N15 is connected to nodes N11 and N13 through switches SW11 and SW13, respectively. The node N16 is connected to nodes N12 and N14 through switches SW12 and SW14, respectively.

The operational amplifier 20 has its inverting output terminal connected to a node NO1 and its non-inverting input terminal through a capacitor 23. The operational amplifier 20 has its non-inverting output terminal connected to a node NO2 and its inverting input terminal through a capacitor 24.

The operational amplifier 20 has its non-inverting input terminal connected to a reference terminal that receives reference voltage Vag through a switch SW15 and its inverting input terminal connected to the reference terminal through a switch SW17. The operational amplifier 20 has its inverting output terminal connected to the reference terminal through the switch SW16 and its non-inverting output terminal connected to the reference terminal through a switch SW18. The nodes NO1 and NO2 are grounded through capacitors 25 and 26, respectively.

The switches SW11 to SW18 are each made of a CMOS switch. These switches SW1 to SW18 are controlled in response to a control signal SW or the inverted signal thereof.

The differential amplifier 2a is provided with the analog signal Vin at the input terminal In and the analog signal VDA resulting from the D/A conversion by the D/A converter 8. More specifically, analog signals Vin(+) and Vin(−) are applied to the nodes N11 and N12, respectively. Here, Vin=Vin(+)−Vin(−) stands. Analog signals VDA(+) and VDA(−) are applied to the nodes N13 and N14, respectively. Here, VDA=VDA(+)−VDA(−) stands. Analog signals Vout(+) and Vout(−) appear at the nodes NO1 and NO2, respectively. Here, Vout=Vout(+)−Vout(−) stands.

Figure 7:
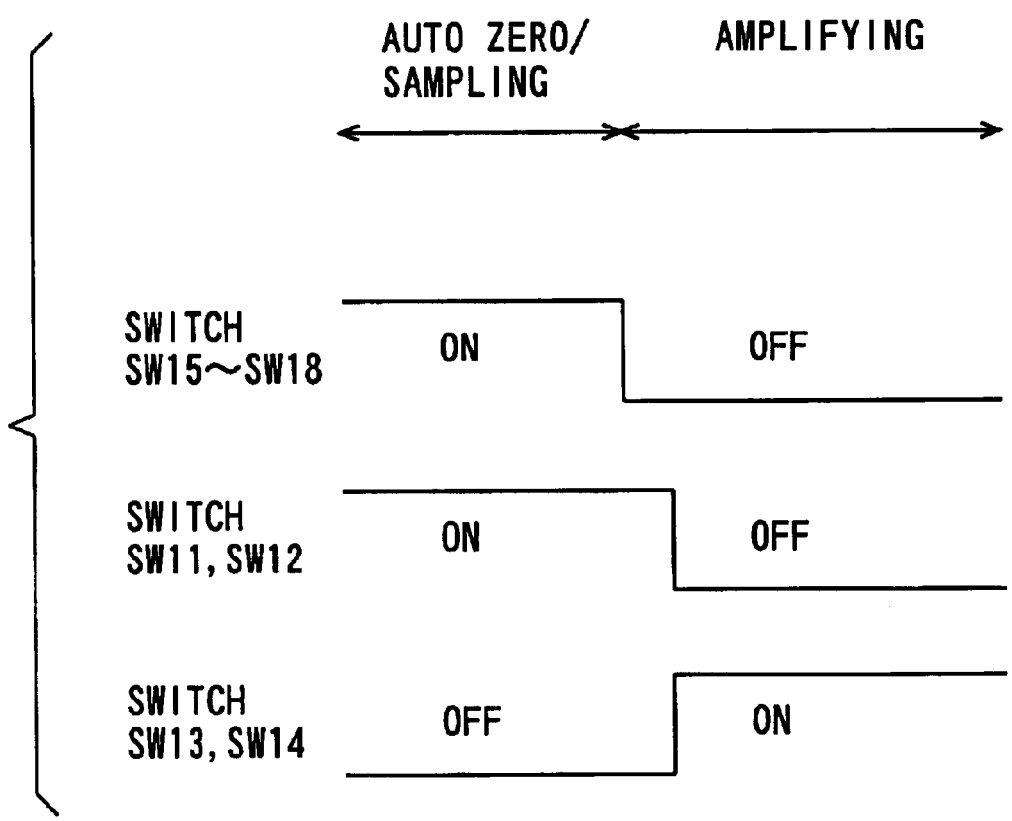
FIG. 7 is a timing chart for use in illustration of the operation of the differential amplifier in FIG. 6.

Now, with reference to FIG. 7, the operation of the differential amplifier 2a in FIG. 6 will be described. FIG. 7 is a timing chart for use in illustration of the operation of the differential amplifier 2a in FIG. 6. Here, the capacitance values of the capacitors 23 and 24 are each C, and the capacitance values of the capacitors 21 and 22 are each KC. K is a constant.

In auto zero operation and sampling operation, the switches SW11, SW12, and SW15 to SW18 turn on, while the switches SW13 and SW14 turn off. In this way, the non-inverting and inverting input terminals of the operational amplifier 20 are brought to an equal potential, and the inverting and non-inverting output terminals are brought to an equal potential. The analog signal Vin(+) is input to the node N15 through the switch SW11, and the analog signal Vin(−) is input to the node N16 through the switch SW12. More specifically, the analog signals Vin(+) and Vin(−) are sampled.

Then, the switches SW15 to SW18 turn off, and then the switches SW11 and SW12 turn off. At the time, the analog signals Vin(+) and Vin(−) are held in the capacitors 21 and 22, respectively.

In amplifying operation, the switches SW13 and SW14 turn on. This allows the analog signal VDA(+) to be input to the node N15 through the switch SW13 and the analog signal VDA(−) to be input to the node N16 through the switch SW14. Consequently, the difference between the analog signals Vin(+) and VDA(+) is amplified by K times, and the difference between the analog signals Vin(−) and VDA(−) is amplified by K times. As a result, the analog signal Vout(+) appears at the node NO1, and the analog signal Vout(−) appears at the node NO2. The voltage (analog signal Vout) between the nodes NO1 and NO2 is represented by the following expression:

$$Vout=Vout(+)-Vout(-)=[\{Vin(+)-VDA(+)\}-\{Vin(-)-VDA(-)\}]\cdot K=(Vin-VDA)\cdot K$$

Note that the structure and operation of the differential amplifier 4a in FIG. 1 and the differential amplifier 12a in FIG. 3 are the same as those of the differential amplifier 2a in FIGS. 6 and 7.

FIG. 8 is a circuit diagram of the configuration of the sub A/D converter 7 in the analog-digital conversion circuit 100 in FIG. 1. The sub A/D converter 7 in FIG. 8 is an full parallel comparison (flush) type sub A/D converter.

The sub A/D converter 7 in FIG. 8 includes n resistors R, n voltage comparators D1 to Dn and an encoder 70.

All the resistors R have the same resistance value and are connected in series between a node N31 that receives high potential side reference voltage VRT and a node N32 that receives low potential side reference voltage VRB. Here, the potentials at nodes N41 to N4n between the n resistors R between the node N32 and N31 are VR(1) to VR(n), respectively.

An analog signal Vin is input to the non-inverting input terminals of the voltage comparators D1 to Dn. The potentials VR(1) to VR(n) at the nodes N41 to N4n are applied to the inverting input terminals of the voltage comparators D1 to Dn, respectively.

In this way, the output signals VD1 to VDn of the voltage comparators D1 to Dn attain a high level when the analog signal Vin is higher than the potentials VR(1) to VR(n). These signals attain a low level when the analog signal Vin is lower than the potentials VR(1) to VR(n).

The encoder 70 encodes the output signals VD1 to VDn of the voltage comparators D1 to Dn and outputs a 4-bit digital signal Dout.

Note that the structure and operation of the sub A/D converter 9 in FIG. 1 and the sub A/D converter 14 in FIG. 3 are the same as those of the sub A/D converter 7 in FIG. 8.

FIG. 9 is a circuit diagram of a differential voltage comparator used in the sub A/D converter 7 in FIG. 8.

In FIG. 9, a differential amplifying circuit 50 includes P-channel MOS field effect transistors (hereinafter referred to as "PMOS transistors") 51 and 52, N-channel MOS field effect transistors (hereinafter referred to as "NMOS transistors") 53 and 54, and a constant current source 57. A saturation NMOS transistor is used for the constant current source 57.

The PMOS transistor 51 is connected between a node ND and an output node NO11, and the PMOS transistor 52 is connected between the node ND and an output node NO12. The NMOS transistor 53 is connected between the output node NO11 and a node NS, and the NMOS transistor 54 is connected between the output node NO12 and the node NS.

The node ND is provided with power supply voltage $V_{DD}$ and the node NS is grounded through the constant current source 57. The PMOS transistors 51 and 52 have their gates provided with bias voltage $V_B$. The NMOS transistors 53 and 54 have their gates connected to input nodes NA and NB, respectively.

The input node NA is connected to the node N1 through a capacitor 55, and the input node NB is connected to a node N2 through a capacitor 56. A switch SW31 is connected between the input node NA and the output node NO11, and a switch SW41 is connected between the input node NB and the output node NO12. Switches SW32 and SW33 are connected in parallel to the node N1, and switches SW42 and SW43 are connected in parallel to the node N2.

The switches SW31 to SW33, and the switches SW41 to SW43 are each made of a CMOS switch. These switches are controlled in response to the control signal SW or the inverted signal thereof.

Input voltages $V_1(+)$ and $V_2(+)$ are applied to the input ends of the switches SW32 and SW33, respectively and input voltages $V_1(-)$ and $V_2(-)$ are applied to the input ends of the switches SW42 and SW43, respectively. Output voltages $V_o(+)$ and $V_o(-)$ are led from the output nodes NO11 and NO12.

Here, the difference between the input voltages $V_1(+)$ and $V_2(+)$ is the differential input voltage $V(+)$, and the difference between the input voltages $V_1(-)$ and $V_2(-)$ is the differential input voltage $V(-)$. The difference between the output voltages $V_o(+)$ and $V_o(-)$ is the differential output voltage $V_o$. In this case, the analog signal Vin in FIG. 8 corresponds to the differential input voltage $V(+)$ and any of the potentials VR(1) to VR(n) corresponds to the differential input voltage $V(-)$. Any of the output signals VD1 to VDn corresponds to the differential output voltage $V_o$.

Figure 10:
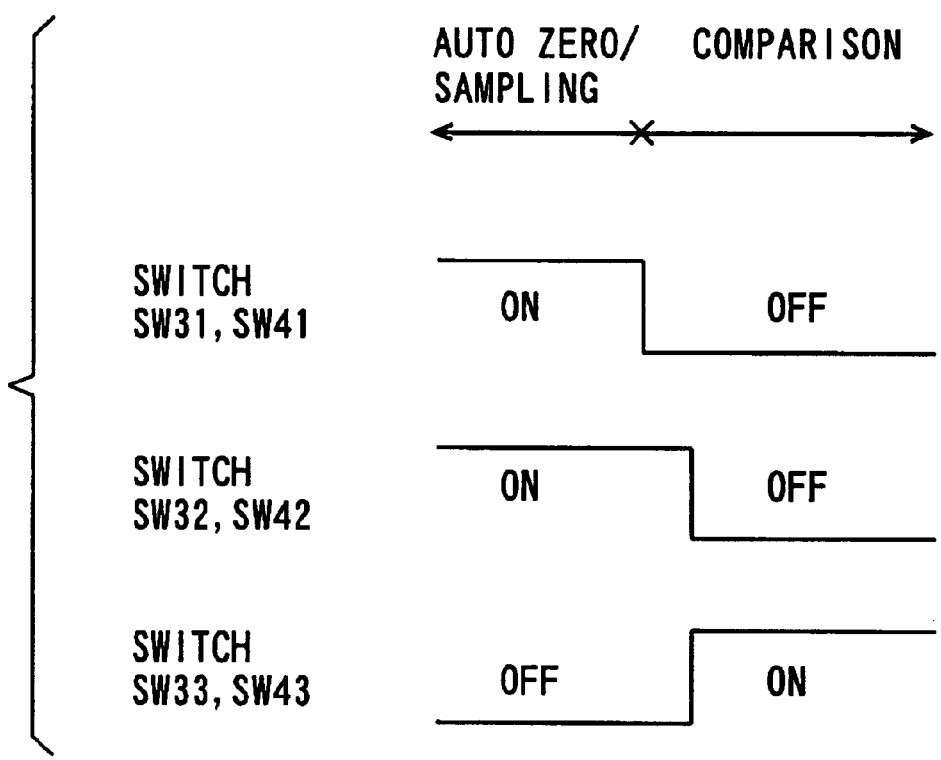
FIG. 10 is a timing chart for use in illustration of the operation of the voltage comparator in FIG. 9.

FIG. 10 is a timing chart for use in illustration of the operation of the voltage comparator in FIG. 9.

In auto zero operation and sampling operation, the switches SW31, SW41, SW32, and SW42 turn on, and the switches SW33 and SW43 turn off. In this way, the input node NA and the output node NO11 are brought to an equal potential, and the input node NB and the output node NO12 are brought to an equal potential. The input voltage $V_1(+)$ is input to the input node NA through the switch SW32 and the input voltage $V_1(-)$ is input to the input node NB through the switch SW42. More specifically, the input voltages $V_1(+)$ and $V_1(-)$ are sampled.

Then, the switches SW31 and SW41 turn off, and then the switches SW32 and SW42 turn off. At the time, the input voltages $V_1(+)$ and $V_1(-)$ are held at the capacitors 55 and 56, respectively.

In comparison operation, the switches SW33 and SW43 turn on. Then, the input voltage $V_2(+)$ is input to the input node NA through the switch SW33, and the input voltage $V_2(-)$ is input to the input node NB through the switch SW43. Consequently, the voltage change at the input node NA equals to $V_2(+)-V_1(+)$, and the voltage change at the input node NB equals to $V_2(-)-V_1(-)$.

Based on the result of comparison between the differential input voltage $V(+)=V_2(+)-V_1(+)$ at the node NA and the differential input voltage $V(-)=V_2(-)-V_1(-)$ at the node NB, one of the output voltage $V_o(+)$ at the output node NO11 and the output voltage $V_o(-)$ at the output node NO12 changes toward the power supply voltage $V_{DD}$, and the other voltage changes toward the ground potential. In this way, the differential output voltage between the output nodes NO11 and NO12 changes toward the positive or negative side from 0V based on the result of comparison.

Note that the structure and operation of the voltage comparators D2 to Dn in FIG. 8 are the same as those of the voltage comparator D1 in FIGS. 9 and 10.

Figure 11:
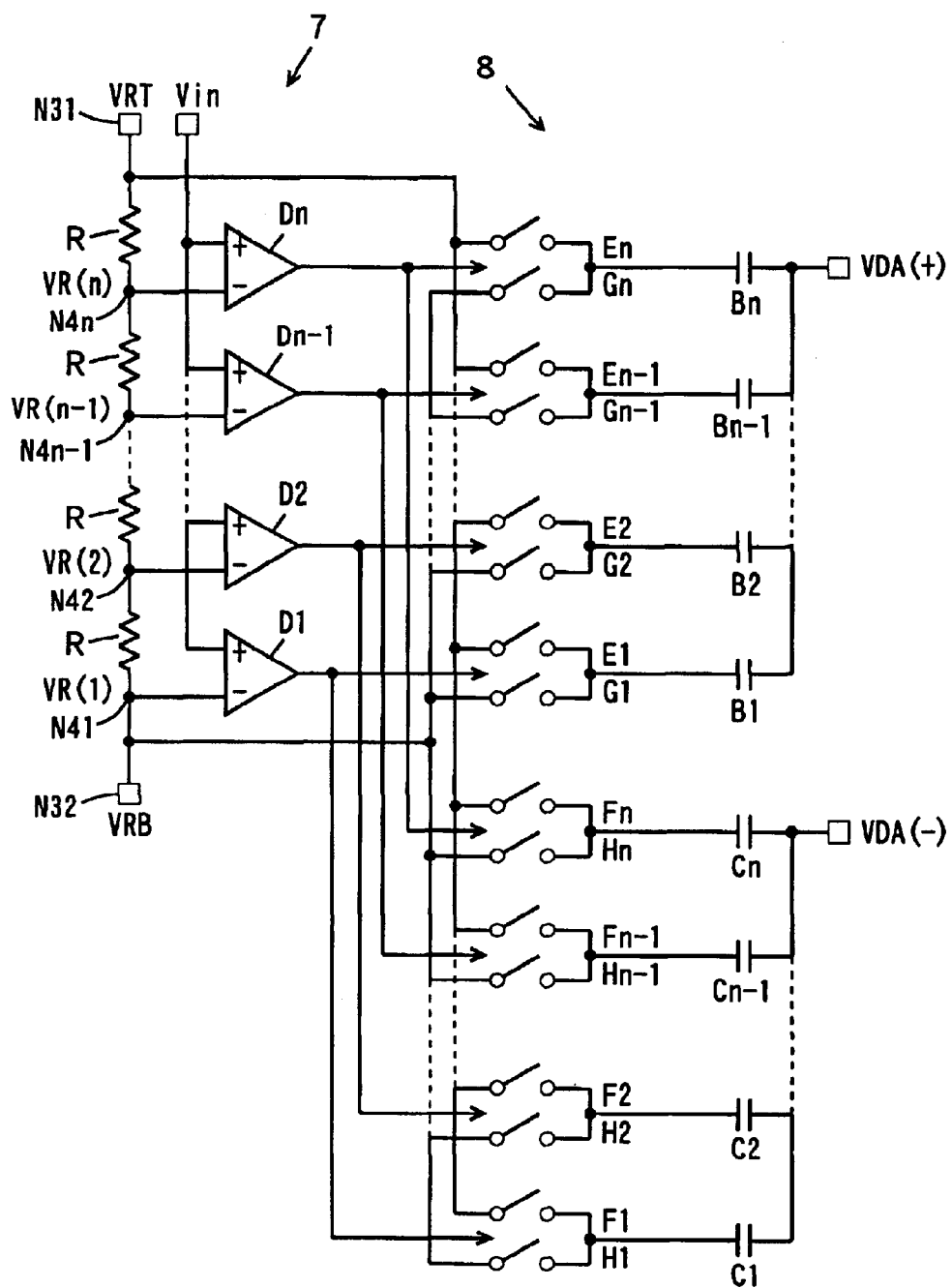
FIG. 11 is a circuit diagram of a sub A/D converter and a D/A converter in the analog-digital conversion circuit in FIG. 1.
Figure 12:
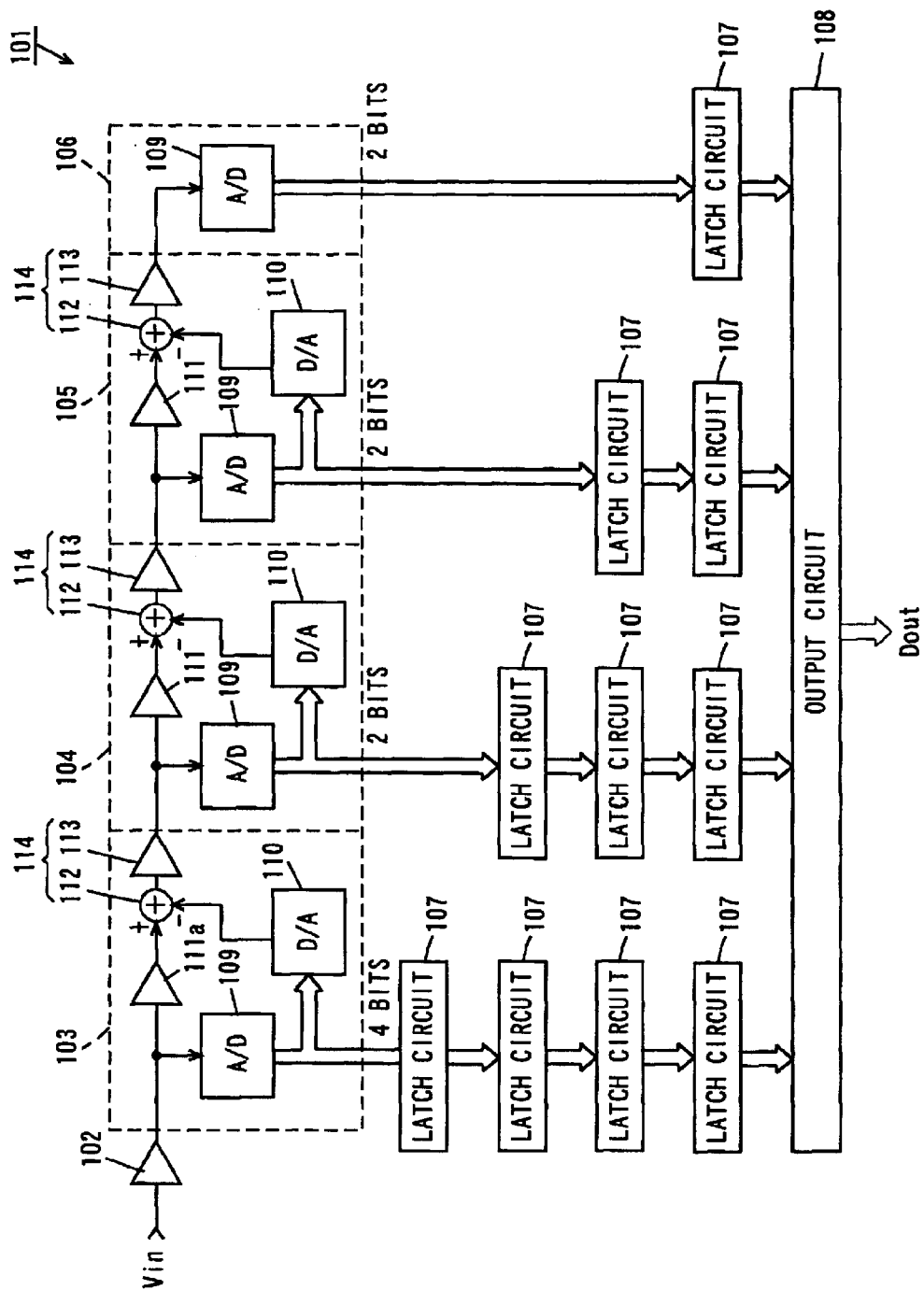
FIG. 12 is a block diagram of the configuration of a conventional analog-digital conversion circuit.

FIG. 11 is a circuit diagram of the sub A/D converter 7 and the D/A converter 8 in the analog-digital conversion circuit 10 in FIG. 1. The D/A converter 8 is a capacitor array type, D/A converter. Note that the encoder 70 in FIG. 8 is not shown in FIG. 11.

The D/A converter 8 includes sets of n switches E1 to En, F1 to Fn, G1 to Gn, and H1 to Hn (each set of switches connected in an array), n positive side capacitors B1 to Bn, and n negative side capacitors C1 to Cn.

The capacitors B1 to Bn and C1 to Cn all have the same capacitance value c. The differential positive side output voltage VDA(+) is generated from the terminals on one side of the capacitors B1 to Bn (hereinafter referred to as "output terminals"), and the differential negative side output voltage VDA(-) is generated from the terminals on one side of the capacitors C1 to Cn (hereinafter referred to as "output terminals"). Note that the other terminals of the capacitors B1 to Bn and C1 to Cn are referred to as "input terminals."

The terminals on one side of the switches E1 to En are connected to the node N31, and the other terminals are connected to the input terminals of the capacitors B1 to Bn, respectively. The terminals on one side of the switches F1 to Fn are connected to the node N31 and the other terminals are connected to the input terminals of the capacitors C1 to Cn. The terminals on one side of the switches G1 to Gn are connected to the node N32, and the other terminals are connected to the input terminals of the capacitors B1 to Bn. The terminals on one side of the switches H1 to Hn are connected to the node N32, and the other terminals are connected to the input terminals of the capacitors C1 to Cn.

Among the switches E1 to En, F1 to Fn, G1 to Gn, and H1 to Hn, those with the same suffix number form a quadruple switch. For example, the switches E1, F1, G1, and H1 form one, and the switches En, Fn, Gn, and Hn form another. The switches E1 to En, F1 to Fn, G1 to Gn, and H1 to Hn turn on/off in response to the output levels of the voltage comparators D1 to Dn, respectively. For example, when the output of the voltage comparator Dn is in a high level, the switches En and Hn turn on, and the switches Gn and Fn turn off. Conversely, when the output of the voltage comparator Dn is in a low level, the switches En and Hn turn off, and the switches Gn and Fn turn on.

Now, the operation of the D/A converter 8 will be described. In the initial condition, the potentials at the input and output terminals of each of the capacitors B1 to Bn are both at 0V. The switches E1 to En, F1 to Fn, G1 to Gn, and H1 to Hn are all in an off state. Therefore, in the initial condition, the charge (electric quantity) Q1 accumulated in all the capacitors B1 to Bn and C1 to Cn is zero (Q1=0).

Here, when the outputs of m out of the n voltage comparators D1 to Dn attain a high level, m switches among the switches E1 to En turn on, the (n−m) switches turn off, the (n−m) switches among the switches G1 to Gn turn on and the remaining m switches turn off. According to the on/off operation of the switches E1 to En and G1 to Gn, the charge Q2 accumulated in all the capacitors B1 to Bn is represented by the following expression (A1):

$$Q2=m(VRT-VDA(+))c+(n-m)(VRB-VDA(+))c \quad (A1)$$

According to the law of conservation of charge, Q1=Q2 results. Therefore, the analog signal VDA(+) can be represented by the following expression (A2):

$$VDA(+)=VRB+m(VRT-VRB)/n \quad (A2)$$

Meanwhile, when the outputs of m out of the n voltage comparators D1 to Dn attain a high level, m switches among the switches H1 to Hn turn on and the (n−m) switches turn off. The (n−m) switches among the switches F1 to Fn turn on, and the remaining m switches turn off. According to the on/off operation of the switches H1 to Hn and F1 to Fn, charge Q3 accumulated in all the capacitors C1 to Cn is represented by the following expression (A3):

$$Q3=(n-m)(VRT-VDA(-))c+m(VRB-VDA(-))c \quad (A3)$$

According to the law of conservation of charge, Q1=Q3 results. Therefore, the analog signal VDA(−) is represented by the following expression (A4):

$$VDA(-)=VRT-m(VRT-VRB)/n \quad (A4)$$

Therefore, from the expressions (A2) and (A4), the analog signal VDA is represented by the following expression (A5):

$$VDA=VDA(+)-VDA(-)=VRB-VRT+2m(VRT-VRB)/n \quad (A5)$$

As in the foregoing, in the analog-digital conversion circuits 100 and 100*a* according to the embodiment, the necessary area is reduced, and various bit structures can be implemented by the same hardware structure. Therefore, the circuit is most suitably applied to an embedded type analog-digital conversion circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog-digital conversion circuit, comprising:
    a first circuit having first and second nodes;
    a selector that selectively applies one of an input analog signal and an analog signal at said second node to said first node; and
    a control device that controls said selector,
    said first circuit comprising:
    a first operational amplifier that amplifies an analog signal from said first node;
        a first analog-digital converter that converts an analog signal from said first node into a digital signal, the analog signal input to said first operational amplifier being the same as the analog signal input to said first analog-digital converter;
        a first digital-analog converter that converts the digital signal output from said first analog-digital converter into an analog signal; and
        a first differential amplifier that amplifies the difference between the analog signal from said first operational amplifier and the analog signal output from said first digital-analog converter and outputs the amplified difference to said second node,
    said control device controlling said selector so that after the input analog signal is applied to said first node, conversion operation by said first analog-digital converter, conversion operation by said first digital-analog converter, and amplifying operation by said first differential amplifier are carried out for a prescribed number of cycles.

2. The analog-digital conversion circuit according to claim 1, wherein
    said first circuit further comprises a first operational amplifier that amplifies the analog signal at said first node and applies the amplified signal to said first differential amplifier.

3. The analog-digital conversion circuit according to claim 1, further comprising a second circuit provided preceding said first circuit by at least one stage through said selector,
    said second circuit comprising:
        a second analog-digital converter that converts an input analog signal into a digital signal;
        a second digital-analog converter that converts a digital signal output from said second analog-digital converter into an analog signal; and
        a second differential amplifier that amplifies the difference between said input analog signal and the analog signal output from said second digital-analog converter and outputs the amplified difference to said first circuit through said selector.

4. The analog-digital conversion circuit according to claim 3, further comprising a second operational amplifier that amplifies said input analog signal and applies the amplified signal to said second differential amplifier.

5. The analog-digital conversion circuit according to claim 1, wherein
    said control device comprises a signal generator that generates a clock signal and a control signal,
    said first analog-digital converter, said first digital-analog converter, and said first differential amplifier in said first circuit operate in response to the clock signal generated by said signal generator, and
    said selector responds to the control signal generated by said signal generator to select between a state in which the input analog signal is applied to said first node and a state in which the analog signal at said second node is applied to said first node.

6. The analog-digital conversion circuit according to claim 5, wherein
    said control signal has a first frequency, said clock signal has a second frequency that is an integral multiple of said first frequency.

7. The analog-digital conversion circuit according to claim 5, further comprising a changing device that changes the frequency of the clock signal generated by said signal generator.

8. The analog-digital conversion circuit according to claim 7, wherein
    said signal generator comprises a phase locked loop having a frequency divider, and
    said changing device comprises a frequency dividing factor setting device that sets a frequency dividing factor by said frequency divider in said phase locked loop.

9. The analog-digital conversion circuit according to claim 3, wherein
said control device comprises a signal generator that generates first and second clock signals and a control signal,
said first analog-digital converter, said first digital-analog converter, and said differential amplifier in said first circuit operate in response to the first clock signal generated by said signal generator,
said second analog-digital converter, said second digital-analog converter, and said second differential amplifier in said second circuit operate in response to the second clock signal generated by said signal generator, and
said selector responds to the control signal generated by said signal generator to select between a state in which the analog signal output from said second differential amplifier in said second circuit is applied to said first node and a state in which the analog signal at said second node is applied to said first node.

10. The analog-digital conversion circuit according to claim 9, wherein
said control signal has a first frequency, said first clock signal has a second frequency that is an integral multiple of said first frequency, and said second clock signal has said first frequency.

11. The analog-digital conversion circuit according to claim 9, wherein
said control device further comprises a changing device that changes the frequency of the first clock signal generated by said signal generator.

12. An analog-digital conversion circuit, comprising:
a first circuit having first and second nodes;
a selector that selectively applies one of an input analog signal and an analog signal at said second node to said first node; and
a control device that controls said selector,
said first circuit comprising:
a first operational amplifier that amplifies an analog signal from said first node;
a first analog-digital converter that converts an analog signal from said first node into a digital signal;
a first digital-analog converter that converts the digital signal output from said first analog-digital converter into an analog signal; and
a first differential amplifier that amplifies the difference between the analog signal from said first operational amplifier and the analog signal output from said first digital-analog converter and outputs the amplified difference to said second node,
said control device controlling said selector so that after the input analog signal is applied to said first node, conversion operation by said first analog-digital converter, conversion operation by said first digital-analog converter, and amplifying operation by said first differential amplifier are carried out for a prescribed number of cycles.

13. An analog-digital conversion circuit, comprising:
a first circuit having first and second nodes;
a selector that selectively applies one of an input analog signal and an analog signal at said second node to said first node; and
a control device that controls said selector,
said first circuit comprising:
a first operational amplifier that amplifies an analog signal from said first node;
a first analog-digital converter that converts an analog signal from said first node into a digital signal;
a first digital-analog converter that converts the digital signal output from said first analog-digital converter into an analog signal; and
a first differential amplifier that amplifies the difference between the analog signal from said first operational amplifier and the analog signal output from said first digital-analog converter and outputs the amplified difference to said second node,
said control device controlling said selector so that after the input analog signal is applied to said first node, conversion operation by said first analog-digital converter, conversion operation by said first digital-analog converter, and amplifying operation by said first differential amplifier are carried out for a prescribed number of cycles.

* * * * *

UNITED STATES PATENT AND TRADEMARK OFFICE
CERTIFICATE OF CORRECTION

PATENT NO. : 6,859,158 B2  
APPLICATION NO. : 10/653251  
DATED : February 22, 2005  
INVENTOR(S) : Atsushi Wada et al.

Page 1 of 1

It is certified that error appears in the above-identified patent and that said Letters Patent is hereby corrected as shown below:

Under "What is Claimed is:",

Under Column 18, Line 34, change "3" to --2--
Under Column 18, Line 52, change "5" to --4--
Under Column 18, Line 57, change "5" to --4--
Under Column 18, Line 61, change "7" to --6--
Under Column 19, Line 2, change "3" to --2--
Under Column 19, Line 22, change "9" to --8--
Under Column 19, Line 28, change "9" to --8--

Signed and Sealed this

Fifth Day of September, 2006

JON W. DUDAS  
*Director of the United States Patent and Trademark Office*

UNITED STATES PATENT AND TRADEMARK OFFICE
CERTIFICATE OF CORRECTION

PATENT NO.       : 6,859,158 B2
APPLICATION NO.  : 10/653251
DATED            : February 22, 2005
INVENTOR(S)      : Atsushi Wada et al.

It is certified that error appears in the above-identified patent and that said Letters Patent is hereby corrected as shown below:

Column 18, lines 13 – 18, delete all of printed claim 2

Column 18, Line 19, change "3." to -- 2. --
Column 18, Line 33, change "4." to -- 3. --
Column 18, Line 37, change "5." to -- 4. --
Column 18, Line 51, change "6." to -- 5. --
Column 18, Line 56, change "7." to -- 6. --
Column 18, Line 60, change "8." to -- 7. --
Column 19, Line 1, change "9." to -- 8. --
Column 19, Line 21, change "10." to -- 9. --
Column 19, Line 27, change "11." to -- 10. --

Column 19, Line 32, add original claim 12, as claim -- 11. The analog-digital conversion circuit according to claim 10, wherein said signal generator comprises a phase locked loop having a frequency divider, and said changing device comprises a frequency dividing factor setting device that sets a frequency dividing factor by said frequency divider in said phase locked loop. --

Column 19, Lines 42 and 43, change, " a first analog-digital converter that converts an analog signal from said first node into a digital signal; " to -- a first analog-digital converter, connected to said first node not through said first operational amplifier, that converts an analog signal from said first node into a digital signal; --

UNITED STATES PATENT AND TRADEMARK OFFICE
CERTIFICATE OF CORRECTION

PATENT NO. : 6,859,158 B2
APPLICATION NO. : 10/653251
DATED : February 22, 2005
INVENTOR(S) : Atsushi Wada et al.

It is certified that error appears in the above-identified patent and that said Letters Patent is hereby corrected as shown below:

Column 20, Lines 25 and 26, change, " a first analog-digital converter that converts an analog signal from said first node into a digital signal; " to -- a first analog-digital converter, connected directly to said first node that converts an analog signal from said first node into a digital signal; --

Signed and Sealed this

Fourteenth Day of August, 2007

JON W. DUDAS
*Director of the United States Patent and Trademark Office*